(12) United States Patent
Murakami et al.

(10) Patent No.: US 9,390,912 B2
(45) Date of Patent: Jul. 12, 2016

(54) FILM FORMING METHOD

(71) Applicant: TOKYO ELECTRON LIMITED, Minato-ku, Tokyo (JP)

(72) Inventors: Hiroki Murakami, Nirasaki (JP); Koji Sasaki, Nirasaki (JP); Keisuke Suzuki, Nirasaki (JP); Yuichiro Morozumi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 124 days.

(21) Appl. No.: 14/167,650

(22) Filed: Jan. 29, 2014

(65) Prior Publication Data

US 2014/0213067 A1    Jul. 31, 2014

(30) Foreign Application Priority Data

Jan. 29, 2013 (JP) .................................. 2013-013825

(51) Int. Cl.
| | | |
|---|---|---|
| C23C 16/36 | (2006.01) | |
| C23C 16/40 | (2006.01) | |
| H01L 21/02 | (2006.01) | |
| C23C 16/455 | (2006.01) | |
| C23C 16/30 | (2006.01) | |

(52) U.S. Cl.
CPC ............ *H01L 21/0228* (2013.01); *C23C 16/30* (2013.01); *C23C 16/45531* (2013.01); *C23C 16/45544* (2013.01); *H01L 21/022* (2013.01); *H01L 21/02126* (2013.01); *H01L 21/02167* (2013.01); *H01L 21/02211* (2013.01); *H01L 21/02219* (2013.01)

(58) Field of Classification Search
CPC .... C23C 16/303; C23C 16/325; C23C 16/36; C23C 16/40
See application file for complete search history.

(56) References Cited

U.S. PATENT DOCUMENTS

| | | | | |
|---|---|---|---|---|
| 6,391,803 B1* | 5/2002 | Kim | ...................... | C23C 16/345 247/E21.271 |
| 8,440,571 B2* | 5/2013 | Weidman | .............. | C23C 16/325 438/718 |
| 2008/0014741 A1* | 1/2008 | Chen | ................... | H01L 21/7682 438/623 |

(Continued)

FOREIGN PATENT DOCUMENTS

| | | |
|---|---|---|
| JP | 2007-281082 A | 10/2007 |
| JP | 2010-153795 A | 7/2010 |

(Continued)

OTHER PUBLICATIONS

Smirnova, Tamara P., et al., "Silicon Carbonitride Films as a Promising Material Synthesized from New Sources". Chemistry for Sutainable Development 9 (2001) 23-29.*

(Continued)

*Primary Examiner* — Bret Chen
(74) *Attorney, Agent, or Firm* — Nath, Goldberg & Meyer; Jerald L. Meyer

(57) ABSTRACT

A film forming method for forming a thin film composed of a SiOCN layer containing at least silicon (Si), oxygen (O), carbon (C) and nitrogen (N) on a surface of a workpiece within an evacuable processing vessel optionally using a silane-based gas, a hydrocarbon gas, a nitriding gas or an oxidizing gas includes forming a first film including at least Si, C and N, and forming a second film including at least Si, C and O. The forming a first film and the forming a second film are set as a cycle and the cycle is performed once or more.

23 Claims, 13 Drawing Sheets

(56) References Cited

U.S. PATENT DOCUMENTS

| | | | | |
|---|---|---|---|---|
| 2010/0124618 A1* | 5/2010 | Kobayashi | ............ | C23C 16/345 427/535 |
| 2010/0181547 A1* | 7/2010 | Kuroda | ................... | H01L 21/74 257/2 |
| 2012/0171874 A1* | 7/2012 | Thridandam | ......... | C23C 16/401 438/786 |

FOREIGN PATENT DOCUMENTS

| | | |
|---|---|---|
| JP | 2010-267971 A | 11/2010 |
| JP | 2011-192875 A | 9/2011 |
| JP | 2011-238894 A | 11/2011 |
| JP | 2011-249480 A | 12/2011 |
| JP | 2012-23399 A | 2/2012 |
| JP | 2012-160704 A | 8/2012 |
| JP | 2012-248844 A | 12/2012 |
| JP | 2013-140944 A | 7/2013 |

OTHER PUBLICATIONS

Fainer, N.I., et al., "PECVD Synthesis of Silicon Carbonitride Layers Using Methyltris(diethylamino)silane as the New Single-Source Precursor". ECS Journal of Solid State Science and Technology, 4 (1) N3153-N3163 (2015).*

Dingemans, G., et al., "Plasma-Assisted Atomic Layer Deposition of Low Temperature SiO2". ECS Transactions, 35 (4) 191-204 (2011).*

* cited by examiner

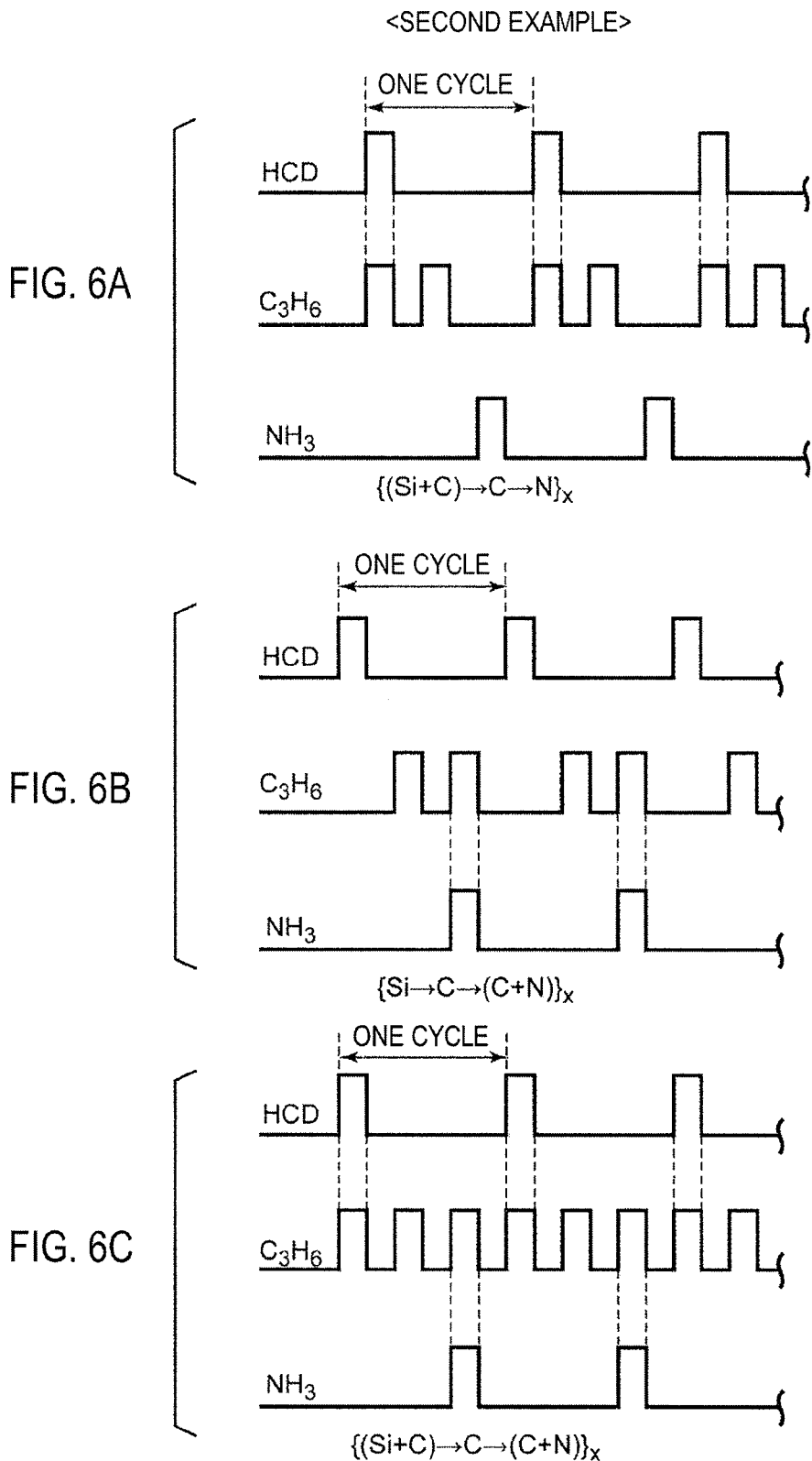

<EIGHTH EXAMPLE>

{Si→(C+O)→O}ₓ

<NINTH EXAMPLE>

{Si→(C+O)}ₓ

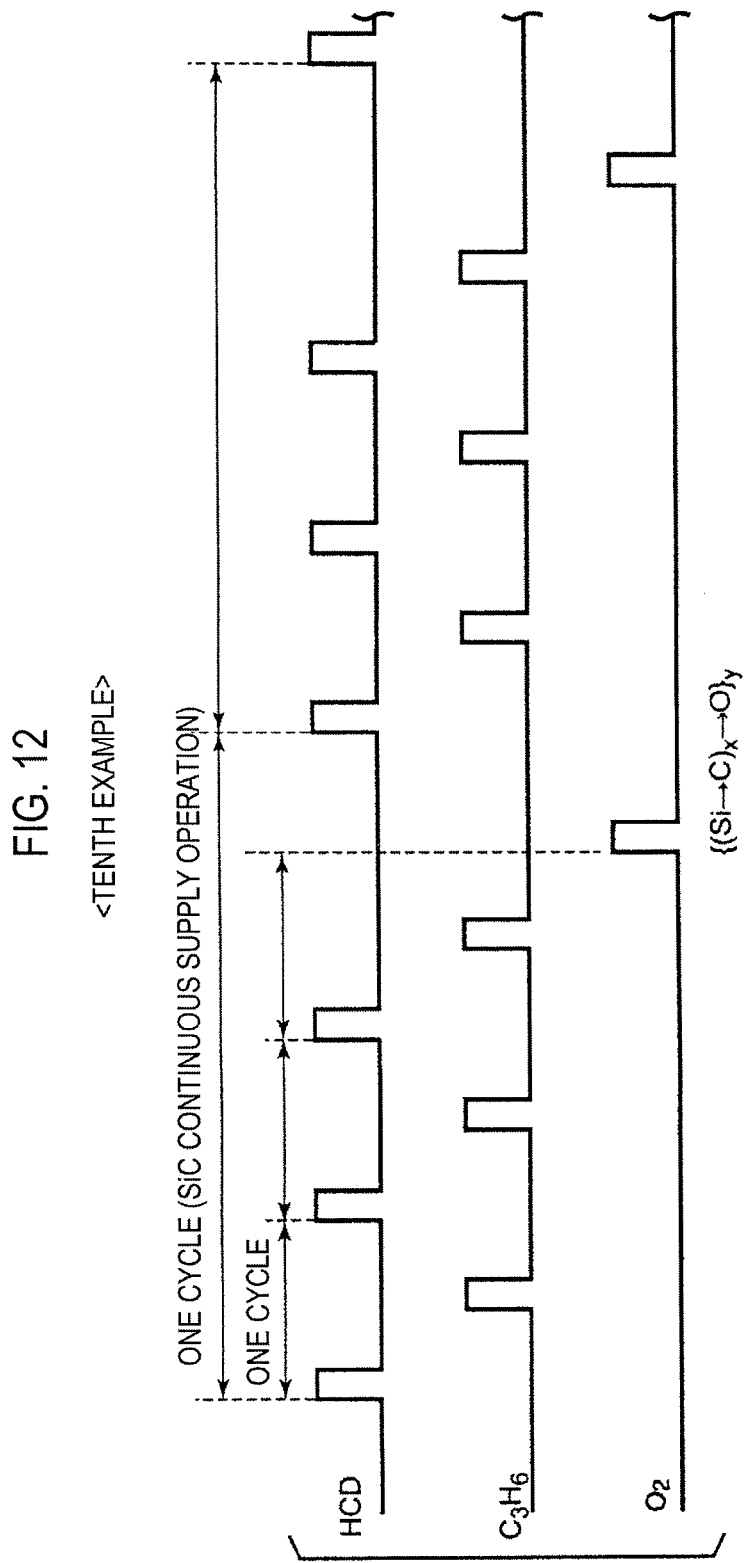

FIG. 13
<ELEVENTH EXAMPLE>
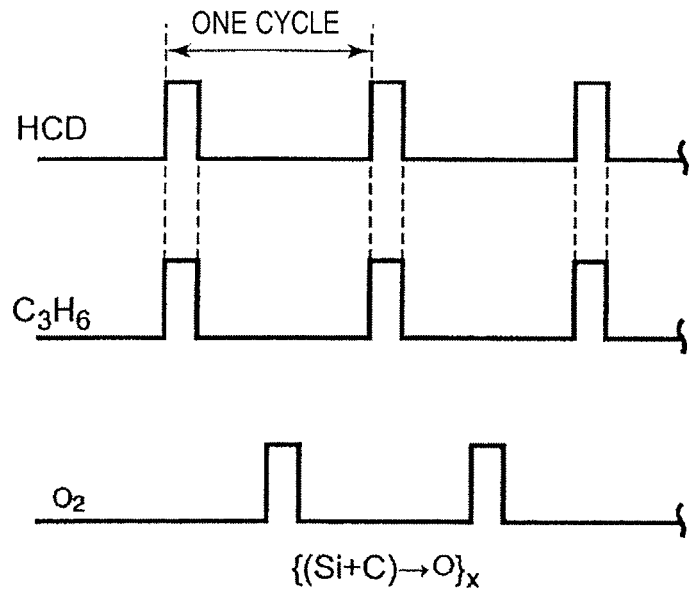
{(Si+C)→O}$_x$
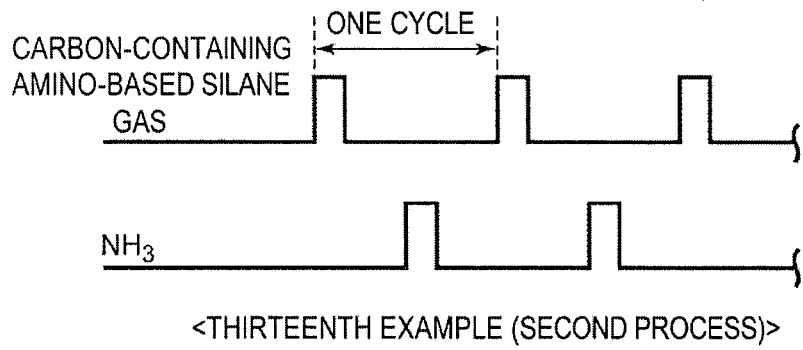
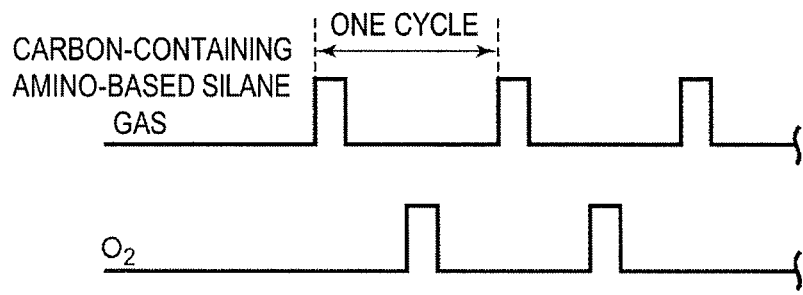

FILM FORMING METHOD

CROSS-REFERENCE TO RELATED APPLICATION

This application claims the benefit of Japanese Patent Application No. 2013-013825, filed on Jan. 29, 2013, in the Japan Patent Office, the disclosure of which is incorporated herein in its entirety by reference.

TECHNICAL FIELD

The present disclosure relates to a film forming method and apparatus for forming a thin film containing silicon (Si), oxygen (O), carbon (C) and nitrogen (N) on a workpiece such as a semiconductor wafer or the like.

BACKGROUND

In general, for the manufacture of a semiconductor integrated circuit, various kinds of processes such as a film forming process, an etching process, an oxidizing process, a diffusing process, a modifying process and a natural oxide film removing process are performed with respect to a semiconductor wafer composed of a silicon substrate or the like. These processes are performed in a single-wafer-type processing apparatus that processes wafers one by one or in a batch-type processing apparatus that processes a plurality of wafers at a time. For example, if these processes are performed in a so-called vertical batch-type processing apparatus, semiconductor wafers are first transferred from a cassette capable of accommodating a plurality of, e.g., twenty five, semiconductor wafers, to a vertical wafer boat and are supported on the vertical wafer boat in multiple stages.

The wafer boat can hold, e.g., about 30 to 150 wafers, depending on the wafer size. The wafer boat is loaded into an evacuable processing vessel from the lower side thereof. Thereafter, the interior of the processing vessel is kept gastight. Then, a predetermined heat treatment is carried out while controlling various kinds of process conditions such as a flow rate of a process gas, a process pressure and a process temperature.

As one of the factors that improve the properties of the semiconductor integrated circuit, it is important to improve the properties of an insulating film existing in the integrated circuit. $SiO_2$, PSG (Phospho Silicate Glass), P (Plasma)-SiO, P (Plasma)-SiN, SOG (Spin On Glass), $Si_3N_4$ (silicon nitride film) and the like are generally used as the insulating film existing in the integrated circuit. In particular, the silicon nitride film tends to be extensively used because the silicon nitride film is superior in insulating property to a silicon oxide film and because the silicon nitride film sufficiently serves as an etching stopper film, an interlayer insulating film or a gate sidewall film.

In recent years, with a view to improve the properties of a circuit element, there is a strong demand for a much lower dielectric constant (low-k) and an increased resistance to etching. Under these circumstances, seeing that an intended process is available without exposing a wafer to a higher temperature even in a so-called vertical batch-type processing apparatus, there has been proposed a method in which a film is formed by repeating formation of one to several layers at an atomic level or repeating formation of one to several layers at a molecular level while intermittently supplying source gases. Such a film forming method is generally called ALD (Atomic Layer Deposition).

In an effort to lower the dielectric constant of a film and to increase the etching resistance of a film as mentioned above, research is being carried out on a technology of adding boron, carbon or oxygen to a base silicon nitride film. Recently, attention is paid to a SiOCN film obtained by adding oxygen and carbon to a silicon nitride film.

In a SiOCN film formed by a method of related art, the concentration of added oxygen or the concentration of added carbon is not sufficiently high. In a method of forming a SiOCN film as a whole by alternately forming a SiCN film and a SiO film, oxygen serving to reduce a dielectric constant can be added in a sufficient amount. However, the method suffers from a problem in that the concentration of carbon which serves to increase an etching resistance still remains insufficient.

SUMMARY

Some embodiments of the present disclosure provide a film forming method and apparatus capable of reducing a specific permittivity and increasing an etching resistance by increasing an oxygen concentration and a carbon concentration in a thin film.

According to one embodiment of the present disclosure, there is provided a film forming method for forming a thin film composed of a SiOCN layer containing at least silicon (Si), oxygen (O), carbon (C) and nitrogen (N) on a surface of a workpiece within an evacuable processing vessel optionally using a silane-based gas, a hydrocarbon gas, a nitriding gas or an oxidizing gas. The method includes a first process for forming a first film including at least Si, C and N; and a second process for forming a second film including at least Si, C and O, wherein the first process and the second process are set as a first cycle and the first cycle is performed once or more.

According to another embodiment of the present disclosure, there is provided a film forming apparatus for forming a thin film on each of workpieces. The apparatus includes an evacuable processing vessel having a vertical tubular shape; a holding unit configured to hold the workpieces in multiple stages and configured to be put into or removed from the processing vessel; a heating unit provided around the processing vessel; a silane-based gas supply unit configured to supply a silane-based gas into the processing vessel; a hydrocarbon gas supply unit configured to supply a hydrocarbon gas into the processing vessel; a nitriding gas supply unit configured to supply a nitriding gas into the processing vessel; an oxidizing gas supply unit configured to supply an oxidizing gas into the processing vessel; and a control unit configured to control the heating unit, the silane-based gas supply unit, the hydrocarbon gas supply unit, the nitriding gas supply unit and the oxidizing gas supply unit so as to perform the film forming method of the above embodiment.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A to 6C are timing charts showing a second example in which a gas supply mode of a first process is changed.

FIG. 12 is a timing chart showing a tenth example in which the gas supply mode of the second process is changed.

FIG. 13 is a timing chart showing an eleventh example in which the gas supply mode of the second process is changed.

FIGS. 14A and 14B are views showing gas supply timing charts of other examples in which a carbon-containing amino-based silane gas is used as a silane-based gas.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
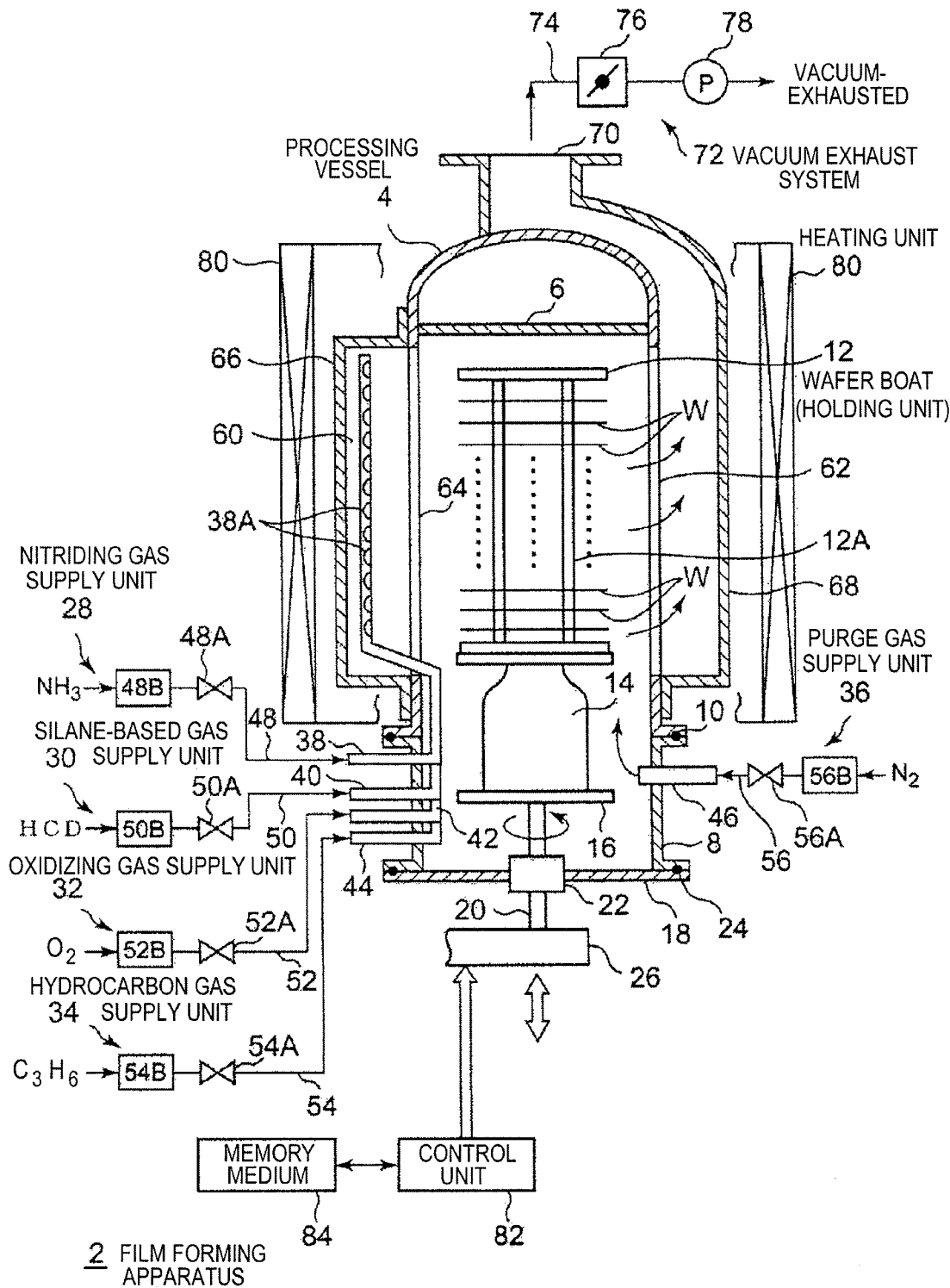
FIG. 1 is a vertical sectional configuration view showing one example of a film forming apparatus according to the present disclosure.
Figure 2:
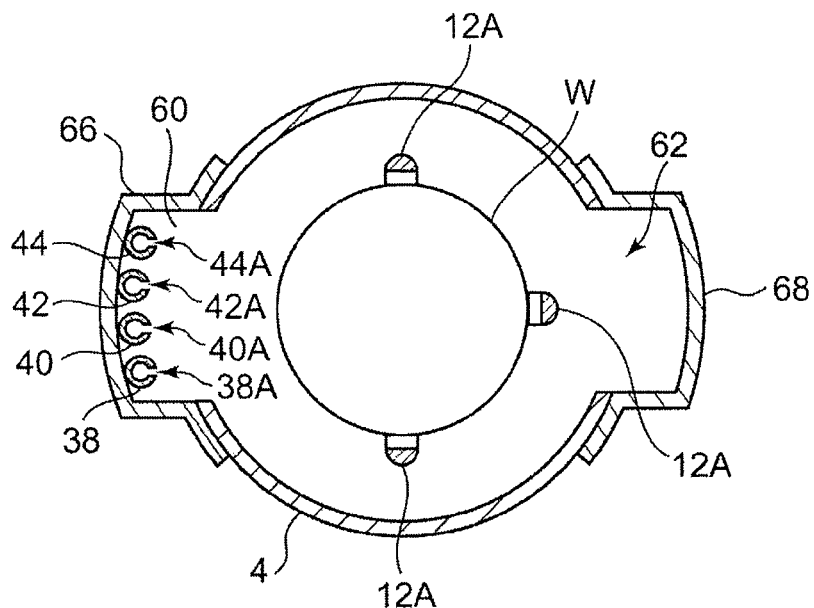
FIG. 2 is a horizontal sectional configuration view showing the film forming apparatus (with a heating unit omitted).

One example of a film forming method and a film forming apparatus according to the present disclosure will now be described in detail with reference to the accompanying drawings. FIG. 1 is a vertical sectional configuration view showing one example of a film forming apparatus according to the present disclosure. FIG. 2 is a horizontal sectional configuration view showing the film forming apparatus (with a heating unit omitted). Description will be made herein on an example in which a SiOCN film as a thin film containing oxygen, nitrogen, silicon and carbon (a silicon nitride film containing oxygen and carbon) is formed by using hexachlorodisilane (HCD) as a silane-based gas, using an ammonia gas ($NH_3$) as a nitriding gas, using an $O_2$ gas as an oxidizing gas, and using a $C_3H_6$ gas (a propylene gas) as a hydrocarbon gas.

As shown in FIGS. 1 and 2, the film forming apparatus 2 includes a cylindrical processing vessel 4 having an open lower end and a ceiling. The processing vessel 4 as a whole is made of, e.g., quartz. A quartz-made ceiling plate 6 is installed and sealed in the ceiling within the processing vessel 4. A manifold 8 formed into a cylindrical shape by, e.g., stainless steel, is connected to the lower end opening of the processing vessel 4 through a seal member 10 such as an O-ring or the like. There is also available an apparatus, the entirety of which is formed of a cylindrical quartz-made processing vessel without installing the stainless steel manifold 8.

The lower end of the processing vessel 4 is supported by the manifold 8. A quartz-made wafer boat 12 as a holding unit for holding a plurality of semiconductor wafers W as workpieces in multiple stages can be moved up and down and can be put into or removed from the processing vessel 4 at the lower side of the manifold 8. In the present example, the wafer boat 12 includes support posts 12A configured to support, e.g., about 50 to 150 wafers W having a diameter of 300 mm, at a substantially regular pitch and in multiple stages.

The wafer boat 12 is mounted on a table 16 through a quartz-made heat-retaining cylinder 14. The table 16 is supported on a rotation shaft 20 that extends through a cover portion 18 made of, e.g., stainless steel, and configured to open and close the lower end opening of the manifold 8. For example, a magnetic fluid seal 22 is installed in the cover portion 18 through which the rotation shaft 20 extends. The magnetic fluid seal 22 rotatably supports the rotation shaft 20 while gas-tightly sealing the rotation shaft 20. A seal member 24 formed of, e.g., an O-ring, is interposed between the peripheral portion of the cover portion 18 and the lower end portion of the manifold 8, thereby hermetically sealing the interior of the processing vessel 4.

The rotation shaft 20 is attached to the tip end of an arm 26 supported by a lift mechanism (not shown), e.g., a boat elevator. The lift mechanism is configured to simultaneously move the wafer boat 12 and the cover portion 18 up and down so that the wafer boat 12 can be put into or removed from the processing vessel 4. Alternatively, the table 16 may be fixedly secured to the cover portion 18 so that the wafers W can be processed without rotating the wafer boat 12.

In the manifold 8, there are installed a nitriding gas supply unit 28 for supplying a nitriding gas, e.g., an ammonia ($NH_3$) gas, into the processing vessel 4, a silane-based gas supply unit 30 for supplying a silane-based gas as a film forming gas, e.g., a HCD (hexachlorodisilane) gas, into the processing vessel 4, an oxidizing gas supply unit 32 for supplying an oxidizing gas, e.g., an $O_2$ gas, into the processing vessel 4, a hydrocarbon gas supply unit 34 for supplying a hydrocarbon gas, e.g., a $C_3H_6$ (propylene) gas, into the processing vessel 4, and a purge gas supply unit 36 for supplying an inert gas as a purge gas, e.g., a $N_2$ gas, into the processing vessel 4.

More specifically, the nitriding gas supply unit 28 includes a gas injection nozzle 38 formed of a quartz pipe extending inward through the sidewall of the manifold 8 and then extending upward in a curved shape. The gas injection nozzle 38 has a plurality of (a multiplicity of) gas injection holes 38A formed at a predetermined interval along the longitudinal direction thereof so that an ammonia gas can be substantially uniformly injected from the respective gas injection holes 38A in the horizontal direction.

Similarly, the silane-based gas supply unit 30 includes a gas injection nozzle 40 formed of a quartz pipe extending inward through the sidewall of the manifold 8 and then extending upward in a curved shape. The gas injection nozzle 40 has a plurality of (a multiplicity of) gas injection holes 40A (see FIG. 2) formed at a predetermined interval along the longitudinal direction thereof so that a HCD gas as a silane-based gas can be substantially uniformly injected from the respective gas injection holes 40A in the horizontal direction.

Similarly, the oxidizing gas supply unit 32 includes a gas injection nozzle 42 formed of a quartz pipe extending inward through the sidewall of the manifold 8 and then extending upward in a curved shape. As with the gas injection nozzle 40 for injecting a silane-based gas, the gas injection nozzle 42 has a plurality of (a multiplicity of) gas injection holes 42A (see FIG. 2) formed at a predetermined interval along the longitudinal direction thereof so that an $O_2$ gas can be substantially uniformly injected from the respective gas injection holes 42A in the horizontal direction.

Similarly, the hydrocarbon gas supply unit 34 includes a gas injection nozzle 44 formed of a quartz pipe extending inward through the sidewall of the manifold 8 and then extending upward in a curved shape. As with the gas injection nozzle 40 for injecting the silane-based gas, the gas injection nozzle 44 has a plurality of (a multiplicity of) gas injection holes 44A (see FIG. 2) formed at a predetermined interval along the longitudinal direction thereof so that a $C_3H_6$ gas can be substantially uniformly injected from the respective gas injection holes 44A in the horizontal direction.

Similarly, the purge gas supply unit 36 includes a gas nozzle 46 installed to extend through the sidewall of the manifold 8. Individual gas paths 48, 50, 52, 54 and 56 are connected to the respective nozzles 38, 40, 42, 44 and 46. Opening/closing valves 48A, 50A, 52A, 54A and 56A and flow rate controllers 48B, 50B, 52B, 54B and 56B such as mass flow controllers or the like are installed in the respective gas paths 48, 50, 52, 54 and 56 so that a $NH_3$ gas, a HCD gas, a $O_2$ gas, a $C_3H_6$ gas and a $N_2$ gas can be supplied while controlling the flow rates thereof.

In a portion of the sidewall of the processing vessel 4, a nozzle accommodating recess portion 60 is formed to extend along the height direction of the processing vessel. In the portion of the processing vessel 4 opposite to the nozzle accommodating recess portion 60, an elongated exhaust port 62 for vacuum-exhausting the internal atmosphere of the processing vessel 4 is formed by, e.g., vertically cutting the sidewall of the processing vessel 4. More specifically, the nozzle accommodating recess portion 60 is formed by vertically cutting the sidewall of the processing vessel 4 at a predetermined width to form a vertically elongated opening 64 and by gas-tightly welding a vertically-elongated quartz-made partition wall 66 having a concave cross-sectional shape to the outer wall of the processing vessel 4 so as to cover the opening 64 at the outer side thereof.

Thus, the nozzle accommodating recess portion 60 opened toward and communicating with the interior of the processing vessel 4 at one side thereof is one-piece formed by depressing a portion of the sidewall of the processing vessel 4 outward in a concave shape. That is to say, the internal space of the partition wall 66 is kept in communication with the interior of the processing vessel 4. The opening 64 is formed sufficiently long in the vertical direction so as to vertically cover all the wafers W held in the wafer boat 12. As shown in FIG. 2, the respective gas injection nozzles 38, 40, 42 and 44 are arranged side by side within the nozzle accommodating recess portion 60.

An exhaust port cover member 68 made of quartz and formed into a substantially C-like cross-sectional shape is welded to the exhaust port 62 arranged opposite to the opening 64, so that the exhaust port cover member 68 can cover the exhaust port 62. The exhaust port cover member 68 extends upward along the sidewall of the processing vessel 4 and forms a gas outlet 70 at the upper side of the processing vessel 4. A vacuum exhaust system 72 for vacuuming the interior of the processing vessel 4 is installed in the gas outlet 70.

More specifically, the vacuum exhaust system 72 includes an exhaust path 74 connected to the gas outlet 70. A pressure regulating valve 76 that can be opened or closed and can adjust the opening degree thereof, and a vacuum pump 78 are sequentially installed in the exhaust path 74. There is also available a structure in which a gas outlet is formed in the lower sidewall of the processing vessel 4. A tubular heating unit 80 for heating the processing vessel 4 and the wafers W accommodated within the processing vessel 4 is installed so as to surround the outer periphery of the processing vessel 4.

The overall operations of the film forming apparatus 2 configured as described above are controlled by a control unit 82 composed of, e.g., a computer. A computer program for carrying out the overall operations is stored in a memory medium 84 such as a flexible disk, a compact disk, a hard disk, a flash memory or the like. More specifically, the start and stop of supply of the respective gases by the opening/closing operations of the respective valves, the flow rates of the respective gases, the process temperature and the process pressure are controlled by the commands coming from the control unit 82.

The control unit 82 includes a user interface (not shown) connected thereto. The user interface includes a keyboard through which an operator performs a command input/output operation or other operations to manage the apparatus, a display configured to visually display an operating situation of the apparatus, and so forth. Communication for the aforementioned control operations may be conducted with reference to the control unit 82 through a communication line.

Next, description will be made on a film forming method (a so-called ALD film forming method) of the present disclosure performed using the film forming apparatus 2 configured as above. In the present method, as can be noted from the flowchart of FIG. 3 which schematically shows the film forming method of the present disclosure, a cycle including a first process S1 for forming a first film containing at least Si, C and N and a second process S2 for forming a second film containing at least Si, C and O is performed one or more times to form a laminated thin film (a SiOCN film) containing at least silicon, oxygen and carbon. It is assumed herein that the cycle is performed m times. In a third step S3, determination is made as to whether the cycle was performed a predetermined number of times. The "m" referred to herein is an integer equal to or larger than 1 (m≥1). The cycle is performed one or more times.

First Example

Figure 4:
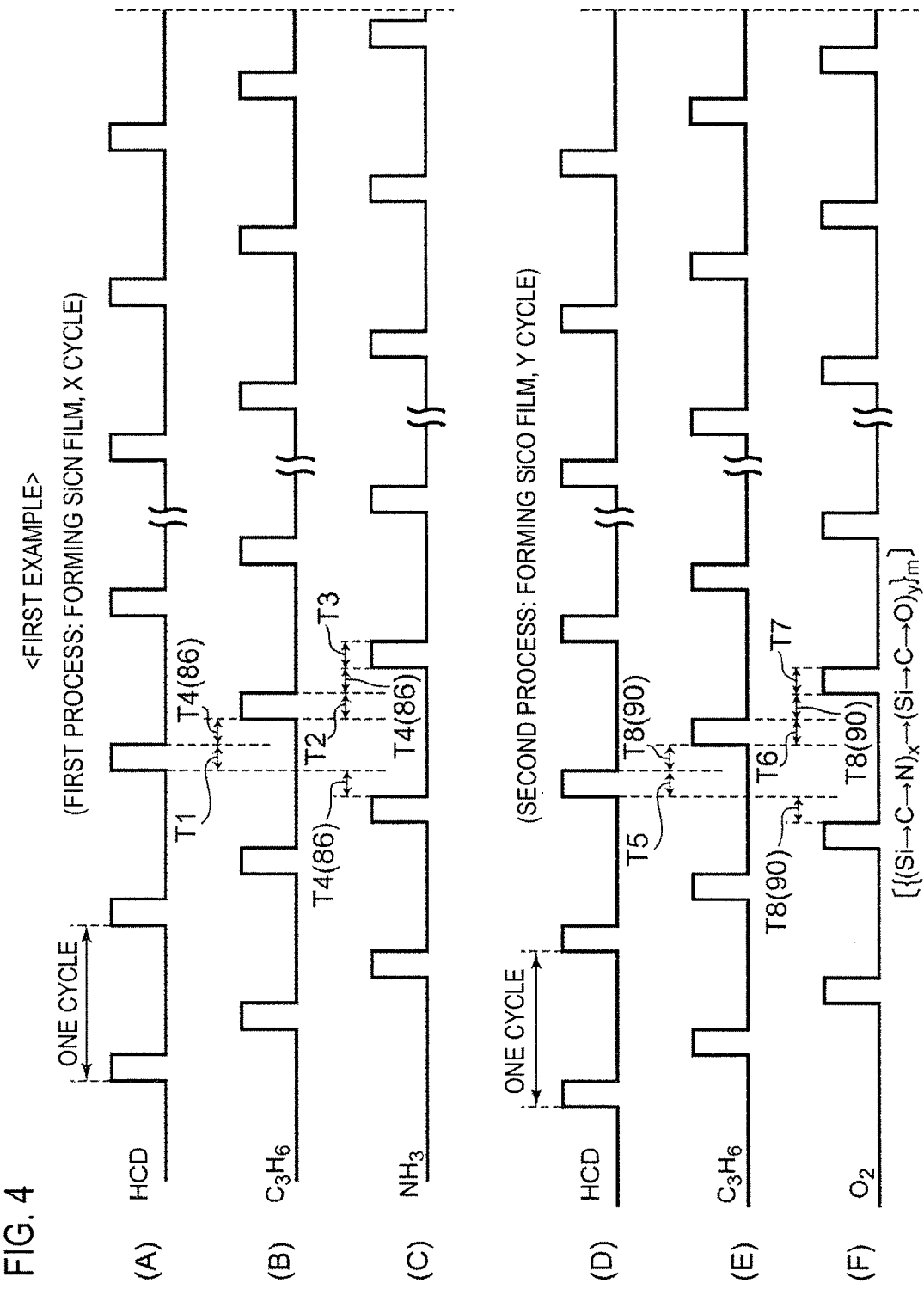
FIG. 4 is a timing chart showing the timings of supply of different gases in a first example of the film forming method according to the present disclosure.
Figure 5:
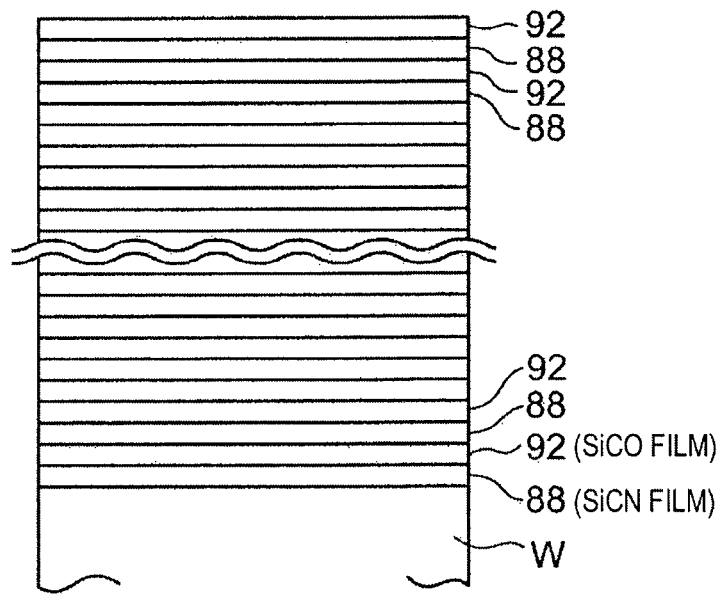
FIG. 5 is a sectional view showing a laminated thin film formed by the first example of the film forming method according to the present disclosure.

First, a first example of the present method will be described with reference to FIGS. 4 and 5. FIG. 4 is a timing chart showing the timings of supply of different gases in the first example of the film forming method according to the present disclosure. FIG. 5 is a sectional view showing a laminated thin film formed by the first example of the film forming method according to the present disclosure. First, the wafer boat 12 holding a plurality of, e.g., 50 to 150, wafers W of 300 mm in diameter kept at a normal temperature is moved up from below the processing vessel 4 and is loaded into the processing vessel 4 heated to a predetermined temperature in advance. The interior of the processing vessel 4 is hermetically sealed by closing the lower end opening of the manifold 8 with the cover portion 18.

The interior of the processing vessel 4 is vacuumed and kept at a predetermined process pressure. By increasing the electric power supplied to the heating unit 80, the wafer temperature is increased and the process temperature is maintained. The $O_2$ gas is supplied from the oxidizing gas supply unit 32. The NH₃ gas is supplied from the nitriding gas supply unit 28. The HCD gas is supplied from the silane-based gas supply unit 30. The C₃H₆ gas is supplied from the hydrocarbon gas supply unit 34.

More specifically, the O₂ gas is injected in the horizontal direction from the respective gas injection holes 42A of the gas injection nozzle 42. The NH₃ gas is injected in the horizontal direction from the respective gas injection holes 38A of the gas injection nozzle 38. The HCD gas is injected in the horizontal direction from the respective gas injection holes 40A of the gas injection nozzle 40. The C₃H₆ gas is injected in the horizontal direction from the respective gas injection holes 44A of the gas injection nozzle 44.

More particularly, in the first process S1 of the first example, HCD as a silane-based gas, C₃H₆ as a hydrocarbon gas and NH₃ as a nitriding gas are intermittently supplied in the named order at different times while vacuuming the interior of the processing vessel 4 (see items (A) to (C) of FIG. 4). That is to say, the respective gases are intermittently supplied in a pulse pattern. Initially, HCD is supplied. Then, C₃H₆ is supplied. Finally, NH₃ is supplied. This cycle is repeatedly performed. One cycle spans between a certain pulse-like HCD supply operation and the next HCD supply operation. The cycle is performed one or more times, namely once or plurality of times, e.g., x times (cycles), where "x" is an integer equal to or larger than 1.

Break periods 86 for performing a purge operation are provided between the HCD supply operation (see item (A) of FIG. 4) and the C₃H₆ supply operation (see item (B) of FIG. 4), between the C₃H₆ supply operation (see item (B) of FIG. 4) and the NH₃ supply operation (see item (C) of FIG. 4), and between the NH₃ supply operation (see item (C) of FIG. 4) and the HCD supply operation (see item (A) of FIG. 4). During the purge operation, the gases remaining within the processing vessel 4 are removed. The purge operation may be performed by continuously vacuuming the interior of the processing vessel 4 with the vacuum exhaust system 72 while stopping the supply of all the gases, by vacuuming the interior of the processing vessel 4 while supplying a purge gas, or by combining both.

During the HCD supply operation, HCD gas molecules adhere to the surface of the wafer W. Next, during the C₃H₆ supply operation, C₃H₆ gas molecules adhere to the surface of the wafer W. During the NH₃ supply operation, the NH₃ gas reacts with the HCD gas and the C₃H₆ gas adhering to the wafer surface, thereby generating SiCN (carbon-containing silicon nitride). This operation is repeated by x cycles to thereby form a SiCN film 88 (It is sometimes the case that the operation is performed once.)

As one example of the process conditions used at this time, the duration T1 of the HCD supply operation (Si supply operation) is, e.g., within a range of about 1 to 5 seconds, e.g., about 3 seconds. The duration T2 of the C₃H₆ supply operation (C supply operation) is, e.g., within a range of about 1 to 5 seconds, e.g., about 3 seconds. The duration T3 of the NH₃ supply operation (N supply operation) is, e.g., within a range of about 15 to 30 seconds, e.g., about 25 seconds. The duration T4 of each of the break periods 86 during which the purge operation is performed is, e.g., within a range of about 1 to 15 seconds, e.g., about 5 seconds. In this regard, the carbon content that affects a wet etching resistance can be controlled to some extent by appropriately selecting the duration T2 of the C₃H₆ supply operation.

The flow rate of HCD is, e.g., within a range of 50 to 1000 sccm. The flow rate of C₃H₆ is, e.g., within a range of 2000 to 5000 sccm. The flow rate of NH₃ is, e.g., within a range of 5000 to 1000 sccm. The process temperature is, e.g., within a range of 500 to 700 degrees C. In this case, if the process temperature is lower than 500 degrees C., the film forming reaction is not sufficiently generated and the film forming rate is too small, which is not desirable. If the process temperature is higher than 700 degrees C., the properties of different films formed in a lower layer deteriorate, which is not desirable. In this regard, it has been found that in some embodiment a process temperature within a range of 500 to 630 degree C. gives good results.

If the first process S1 is finished in the aforementioned manner, the second process S2 is performed subsequently. In the second process S2, the NH₃ gas is merely replaced with an O₂ gas. In other respects, the second process S2 remains the same as the first process SI. That is to say, in the second process S2, HCD as a silane-based gas, C₃H₆ as a hydrocarbon gas and O₂ as an oxidizing gas are intermittently supplied in the named order at different times while vacuuming the interior of the processing vessel 4 (see items (D) to (F) of FIG. 4).

That is to say, the respective gases are intermittently supplied in a pulse pattern. Initially, HCD is supplied. Then, C₃H₆ is supplied. Finally, O₂ is supplied. This cycle is repeatedly performed. One cycle spans between a certain pulse-like HCD supply operation and the next HCD supply operation. The cycle is performed one or more times, namely once or a plurality of times, e.g., y times (cycles), where "y" is an integer equal to or larger than 1.

In this case, break periods 90 for performing the same purge operation as mentioned above are provided between the HCD supply operation (see item (D) of FIG. 4) and the C₃H₆ supply operation (see item (E) of FIG. 4), between the C₃H₆ supply operation (see item (E) of FIG. 4) and the O₂ supply operation (see item (F) of FIG. 4), and between the O₂ supply operation (see item (F) of FIG. 4) and the HCD supply operation (see item (D) of FIG. 4). During the purge operation, the gases remaining within the processing vessel 4 are removed. The mode of performing the purge operation is identical with that of the first process S1.

During the HCD supply operation, HCD gas molecules adhere to the surface of the wafer W. Next, during the C₃H₆ supply operation, C₃H₆ gas molecules adhere to the surface of the wafer W. During the O₂ supply operation, the O₂ gas reacts with the HCD gas and the C₃H₆ gas adhering to the wafer surface, thereby generating SiCO (carbon-containing silicon oxide). This operation is repeated by x cycles to thereby form a SiCO film 92 (It is sometimes the case that the operation is performed once.).

As one example of the process conditions used at this time, the duration T5 of the HCD supply operation (Si supply operation) is, e.g., within a range of about 1 to 5 seconds, e.g., about 3 seconds. The duration T6 of the C₃H₆ supply operation (C supply operation) is, e.g., within a range of about 1 to 5 seconds, e.g., about 3 seconds. The duration T7 of the O₂ supply operation (O supply operation) is, e.g., within a range of about 15 to 30 seconds, e.g., about 25 seconds. The duration T8 of each of the break periods 90 during which the purge operation is performed is, e.g., within a range of about 1 to 10 seconds, e.g., about 5 seconds. In this regard, the carbon content that affects a wet etching resistance can be further controlled, in addition to the first process S1, by appropriately selecting the duration T6 of the C₃H₆ supply operation.

The flow rate of HCD is, e.g., within a range of 50 to 1000 sccm. The flow rate of C₃H₆ is, e.g., within a range of 2000 to 5000 sccm. The flow rate of O₂ is, e.g., within a range of 1000 to 10000 sccm. The process temperature is, e.g., within a range of 500 to 700 degrees C. which is equal to the process temperature of the first process. In this case, if the process temperature is lower than 500 degrees C., the film forming reaction is not sufficiently generated and the film forming rate is too small, which is not desirable. If the process temperature is higher than 700 degree C., the properties of different films formed in a lower layer deteriorate, which is not desirable. In this regard, the process temperature in some embodiments is within a range of 500 to 630 degree C.

If the second process S2 is finished in this manner, it is determined if a cycle including the first process S1 and the second process S2 was performed a predetermined number of cycle times, e.g., m times (S3). As mentioned above, "m" is an integer equal to or larger than 1. "m" may be equal to 1. If the result of determination reveals that the predetermined number of cycle times m is not reached (if "NO" in step S3), the first process S1 and the second process S2 are repeatedly performed to alternately laminate the SiCN film 88 as a first film and the SiCO film 92 as a second film as shown in FIG. 5. If the predetermined number of cycle times m is reached (if "YES" in step S3), the film forming process is terminated.

In this regard, a symbolic notation showing the flow of the first example of the film forming method shown in FIG. 4 is expressed by [(Si→C→N)x→(Si→C→O)y]m, where "Si" indicates the supply of a silicon-containing gas, the "C" indicates the supply of a hydrocarbon gas, "N" indicates the supply of a nitrogen gas, "O" indicates the supply of an oxygen gas, and the arrow "→" indicates the transition to the next step. These definitions hold true in the following description.

In this way, a SiOCN film 96 of the laminate structure shown in FIG. 5 is formed. While the respective gases, namely HCD, $C_3H_6$, $NH_3$ and $O_2$ gases are intermittently supplied in the named order at different times, the present disclosure is not limited thereto. On this point, description will be made later.

The SiOCN film 96 thus formed is very low in an etching rate to, e.g., diluted hydrogen fluoride, and is high in a wet etching resistance. The SiOCN film 96 shows a low dielectric constant and can reduce a leak current. The relative dielectric constant of the laminated SiOCN film 96 thus formed is, e.g., equal to or larger than 4.5 and smaller than 7.0. This makes it possible to accomplish a low dielectric constant. The relative dielectric constant of the laminated SiOCN film 96 can be made significantly smaller than the relative dielectric constant (about 7.0) of a conventionally-used SiN film.

As described above, according to the present disclosure, the method of forming a thin film composed of SiOCN layers can improve (reduce) a relative dielectric constant and can increase an etching resistance by sufficiently increasing an oxygen concentration and a carbon concentration.

Other Examples of the First Process S1

Next, description will be made on other examples of the first process S1. In the first process S1 described above, HCD, $C_3H_6$ and the $NH_3$ are supplied in the named order. However, the present disclosure is not limited thereto but may employ the following gas supply modes.

Second Example

FIGS. 6A to 6C are timing charts showing a second example in which the gas supply mode of the first process is changed. In the second example, the hydrocarbon gas is supplied during at least one of the Si supply operation and the N supply operation.

In the instance shown in FIG. 6A, in addition to the gas supply mode shown in items (A) to (C) of FIG. 4, $C_3H_6$ is further supplied simultaneously with the Si supply operation so as to increase the concentration of carbon contained in a film. A symbolic notation showing the flow of supply of the respective gases at this time is expressed by "{(Si+C)→C→N}x", where the "+" indicates the simultaneous supply of two gases. This definition holds true in the following description, where "x" is an integer equal to or larger than 1.

In the instance shown in FIG. 6B, in addition to the gas supply mode shown in items (A) to (C) of FIG. 4, $C_3H_6$ is further supplied simultaneously with the N supply operation so as to increase the concentration of carbon contained in a film (C/N simultaneous supply operation). A symbolic notation showing the flow of supply of the respective gases at this time is expressed by "{Si→C→(C+N)}x", where "x" is an integer equal to or larger than 1.

In the instance shown in FIG. 6C, in addition to the gas supply mode shown in items (A) to (C) of FIG. 4, $C_3H_6$ is further supplied simultaneously with the Si supply operation and the N supply operation so as to increase the concentration of carbon contained in a film (Si/N simultaneous supply operation). A symbolic notation showing the flow of supply of the respective gases at this time is expressed by "{(Si+C)→C→(C+N)}x", where "x" is an integer equal to or larger than 1. In this case, $C_3H_6$ is supplied in all the steps. Therefore, $C_3H_6$ may not be intermittently supplied in a pulse pattern but may be continuously supplied over the entire film forming period.

Third and Fourth Examples

Figure 7A:
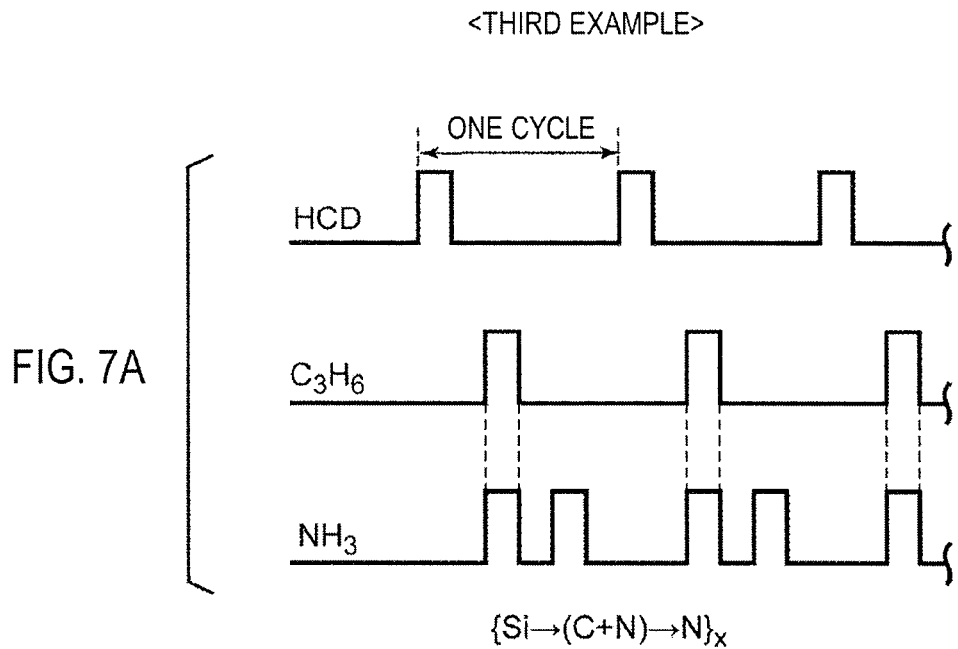
FIGS. 7A and 7B are timing charts showing third and fourth examples in which the gas supply mode of the first process is changed.
Figure 7B:
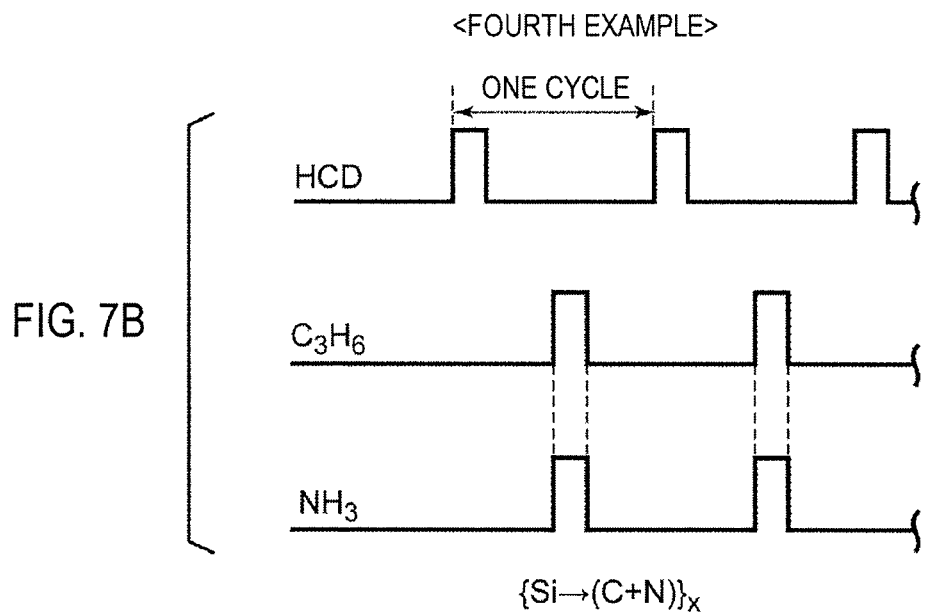

Next, description will be made on third and fourth examples. FIGS. 7A and 7B are timing charts showing third and fourth examples in which the gas supply mode of the first process is changed. In the third example shown in FIG. 7A, in addition to the gas supply mode shown in items (A) to (C) of FIG. 4, $NH_3$ is supplied during the C supply operation so as to perform a C/N simultaneous supply operation.

In this case, it becomes possible to reliably nitride the thin film. A symbolic notation showing the flow of supply of the respective gases at this time is expressed by "{Si→(C+N)→N}x". "x" is an integer equal to or larger than 1.

In case of the fourth example shown in FIG. 7B, $NH_3$ is supplied during the C supply operation so as to perform a C/N simultaneous supply operation, and the N supply operation in which $NH_3$ is independently supplied is omitted. A symbolic notation showing the flow of supply of the respective gases at this time is expressed by "{Si→(C+N)}x", where "x" is an integer equal to or larger than 1.

Fifth Example

Figure 8:
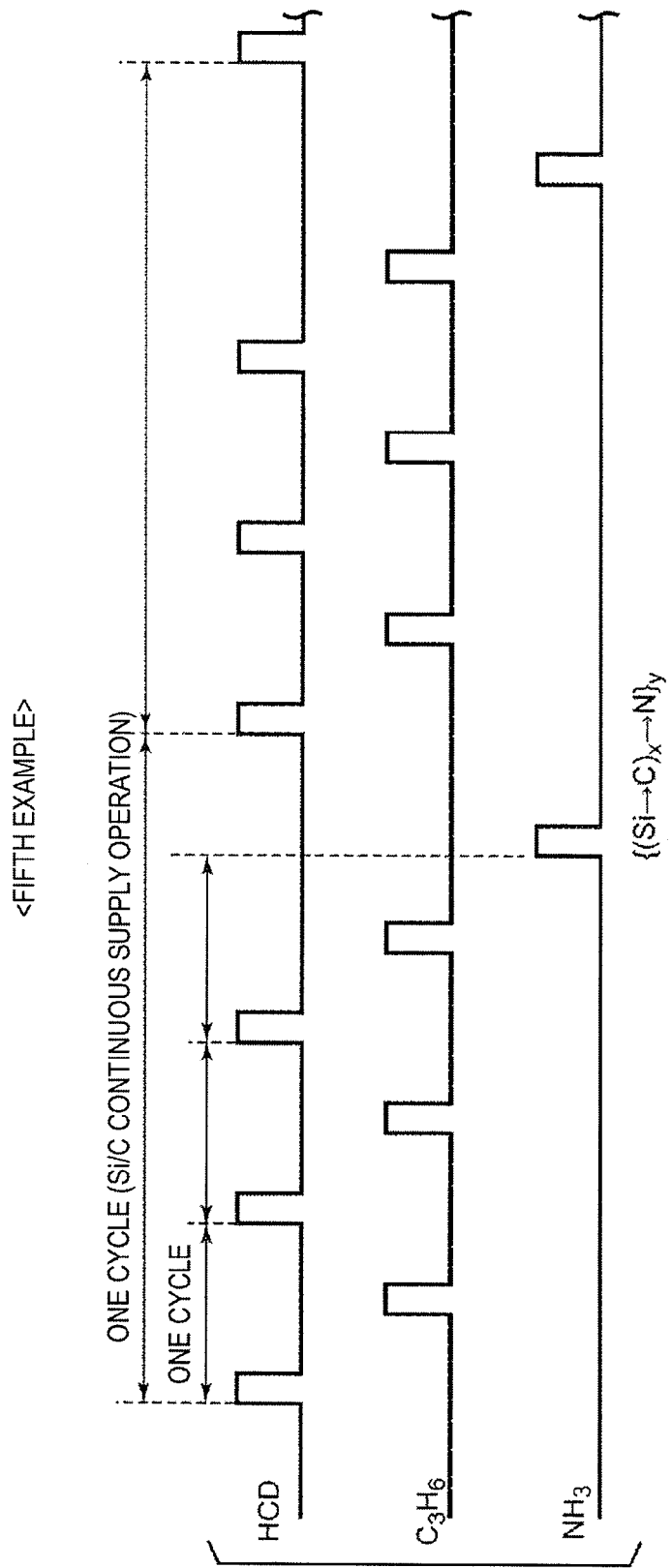
FIG. 8 is a timing chart showing a fifth example in which the gas supply mode of the first process is changed.

Next, description will be made on a fifth example. FIG. 8 is a timing chart showing a fifth example in which the gas supply mode of the first process is changed. In case of the fifth example shown in FIG. 8, a cycle that includes a Si/C continuous supply operation in which a cycle including a Si supply operation for supplying the silane-based gas and a C supply operation for supplying the hydrocarbon gas is performed a plurality of times and an N supply operation for supplying the nitriding gas is performed once or more in the first process.

That is to say, in the instance shown in FIG. 8, the "N supply" is performed after performing the cycle including the "Si supply" and the "C supply" three consecutive times. A symbolic notation showing the flow of supply of the respective gases at this time is expressed by "{(Si→C)x→N}y", where "x" is an integer equal to or larger than 2 and "y" is an integer equal to or larger than 1. In the instance shown in FIG. 8, "x" is equal to 3.

Sixth Example

Figure 9:
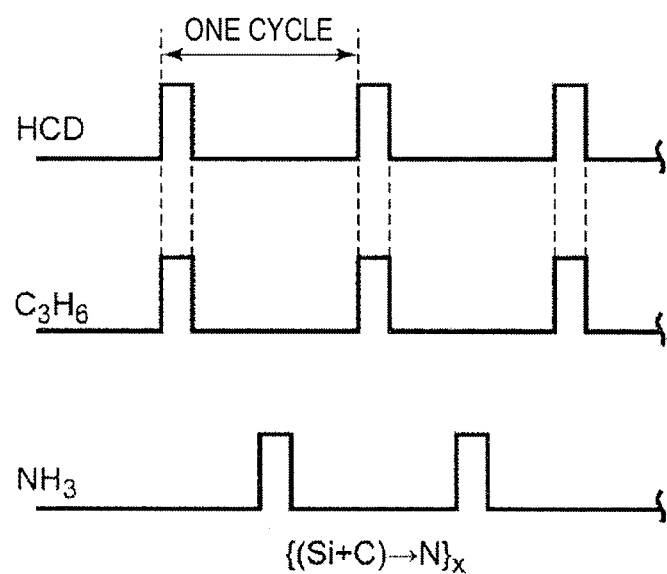
FIG. 9 is a timing chart showing a sixth example in which the gas supply mode of the first process is changed.

Next, description will be made on a sixth example. FIG. 9 is a timing chart showing a sixth example in which the gas supply mode of the first process is changed. In case of the sixth example shown in FIG. 9, a cycle that includes a Si/C simultaneous supply operation for simultaneously supplying the silane-based gas and the hydrocarbon gas and an N supply operation for supplying the nitriding gas is performed one or more times in the first process.

In the instance shown in FIG. 9, the Si/C simultaneous supply operation for simultaneously supplying Si and C is first performed and then the N supply operation is performed. A symbolic notation showing the flow of supply of the respective gases at this time is expressed by "{(Si+C)x→N)}x", where "x" is an integer equal to or larger than 1.

Other Examples of the Second Process S2

The foregoing description is directed to other examples of the first process S1. Now, description will be made on other examples of the second process S2. In the second process S2 described above, HCD, $C_3H_6$ and the $O_2$ are supplied in the named order. However, the present disclosure is not limited thereto but may employ the following gas supply modes.

Seventh Example

Figure 10A:
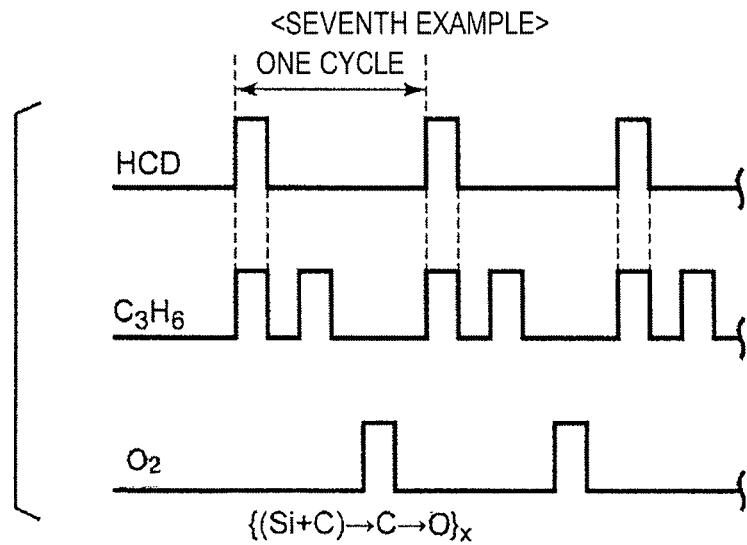
FIGS. 10A to 10C are timing charts showing a seventh example in which a gas supply mode of a second process is changed.
Figure 10B:
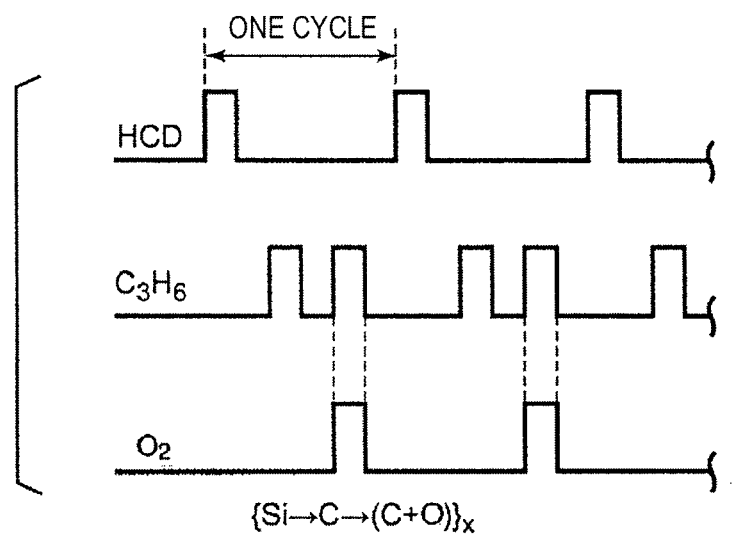
Figure 10C:
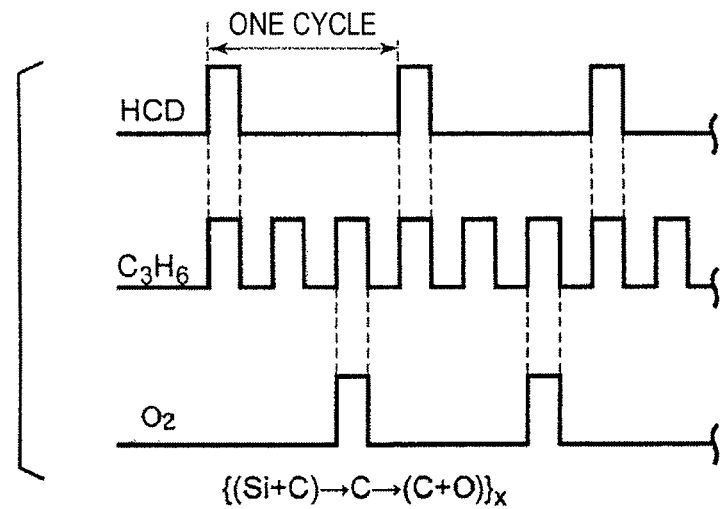

FIGS. 10A to 10C are timing charts showing a seventh example in which the gas supply mode of the second process is changed. In the seventh example, the hydrocarbon gas is supplied during at least one of the Si supply operation and the O supply operation.

In the seventh example, the "$NH_3$" used in the second example shown in FIGS. 6A to 6C is merely replaced with "$O_2$". In other respects, the seventh example remains the same as the second example shown in FIGS. 6A to 6C. In this regard, a symbolic notation showing the flow of supply of the respective gases is expressed by "{(Si+C)→C→O}x" in FIG. 10A, "{Si→C→(C+O)}x" in FIG. 10B, and "{(Si+C)→C→(C+O)}x" in FIG. 10C, where the "x" is an integer equal to or larger than 1.

Eighth and Ninth Examples

Figure 11A:
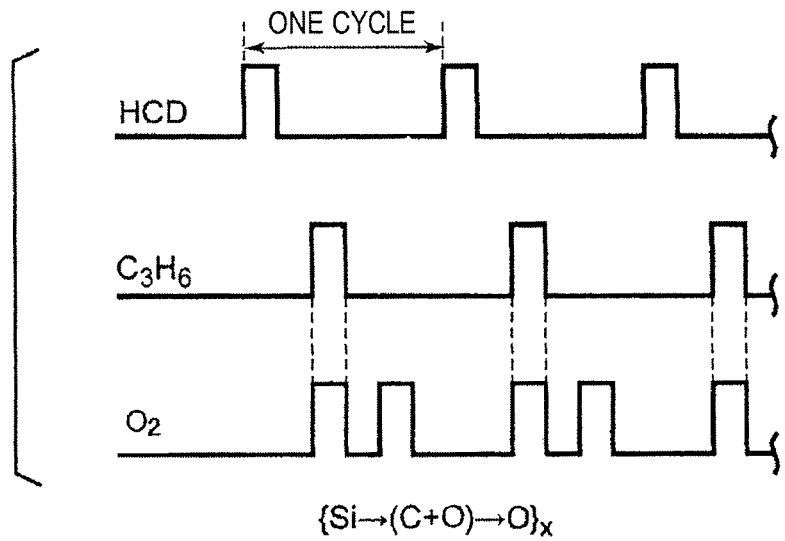
FIGS. 11A and 11B are timing charts showing eighth and ninth examples in which the gas supply mode of the second process is changed.
Figure 11B:
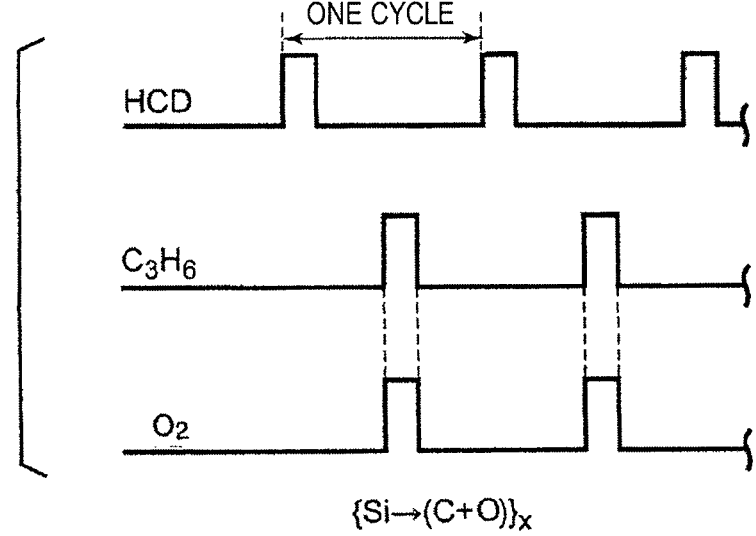

Next, description will be made on eighth and ninth examples. FIGS. 11A and 11B are timing charts showing eighth and ninth examples in which the gas supply mode of the second process is changed. In the eighth example, the oxidizing gas is supplied during the C supply operation. In the ninth example, a cycle that includes a Si supply operation for supplying the silane-based gas and a C/O simultaneous supply operation for simultaneously supplying the hydrocarbon gas and the oxidizing gas is performed one or more times in the second process.

In the eighth and ninth examples, the "$NH_3$" used in the third and fourth examples shown in FIGS. 7A and 7B is merely replaced with "$O_2$". In all other respects, the eighth and ninth examples remain the same as the third and fourth examples. A symbolic notation showing the flow of supply of the respective gases at this time is expressed by "{Si→(C+O)→O}x" in FIG. 11A and "{Si→(C+O)}x" in FIG. 11B, where "x" is an integer equal to or larger than 1.

Tenth Example

Next, description will be made on a tenth example. FIG. 12 is a timing chart showing a tenth example in which the gas supply mode of the second process is changed. In the tenth example shown in FIG. 12, a cycle that includes a Si/C continuous supply operation, in which a cycle including a Si supply operation for supplying the silane-based gas and a C supply operation for supplying the hydrocarbon gas is performed a plurality of times, and a O supply operation for supplying the oxidizing gas is performed one or more times in the second process.

In the tenth example, the "$NH_3$" used in the fifth example shown in FIG. 8 is merely replaced with "$O_2$". In all other respects, the tenth example remains the same as the fifth example. A symbolic notation showing the flow of supply of the respective gases at this time is expressed by "{(Si→C)x→O}y", where "x" is an integer equal to or larger than 2 and the "y" is an integer equal to or larger than 1. In the instance shown in FIG. 12, "x" is equal to 3.

Eleventh Example

Next, description will be made on an eleventh example. FIG. 13 is a timing chart showing an eleventh example in which the gas supply mode of the second process is changed. In case of the eleventh example shown in FIG. 13, a cycle that includes a Si/C simultaneous supply operation for simultaneously supplying the silane-based gas and the hydrocarbon gas and an O supply operation for supplying the oxidizing gas is performed one or more times in the second process.

In the eleventh example, the "$NH_3$" used in the sixth example shown in FIG. 9 is merely replaced with "$O_2$". In all other respects, the eleventh example remains the same as the sixth example. A symbolic notation showing the flow of supply of the respective gases at this time is expressed by "{(Si+C)→O}x", where "x" is an integer equal to or larger than 1.

[Use of a Carbon-Containing Amino-Based Silane Gas as the Silane-Based Gas]

Twelfth and Thirteenth Examples

There are two kinds of amino-based silane gases, namely an amino-based silane gas which does not contain carbon and an amino-based silane gas which contains carbon. If the carbon-containing amino-based silane gas is used as the silane-based gas, it is possible to omit the steps of supplying other kinds of gases as mentioned below. FIGS. 14A and 14B are views showing gas supply timing charts of other examples, i.e., twelfth and thirteenth examples in which the carbon-containing amino-based silane gas is used as the silane-based gas.

The carbon-containing amino-based silane gas contains "Si", "N" and "C" in the raw material thereof. Therefore, if the carbon-containing amino-based silane gas is supplied in the first process S1, the source gas is pyrolyzed to thereby form a SiCN film on the wafer. In this case, it is therefore possible to omit the C supply operation and the N supply operation.

In the aforementioned case, for the purpose of reliably performing a nitriding process, as a twelfth example, a cycle that includes an amino-based silane supply operation for supplying the carbon-containing amino-based silane gas as the silane-based gas and an N supply operation for supplying the nitriding gas may be performed one or more times.

As with the twelfth example shown in FIG. 14A, a cycle in which the N supply operation is performed after supplying the carbon-containing amino-based silane gas may be performed once or a plurality of times.

If the carbon-containing amino-based silane gas is used as the silane-based gas in the second process S2, as a thirteenth example, a cycle that includes an amino-based silane supply operation for supplying the carbon-containing amino-based silane gas as the silane-based gas and an O supply operation for supplying the oxidizing gas may be performed one or more times in the second process.

As with the thirteenth example shown in FIG. 14B, a cycle in which the O supply operation is performed after supplying the carbon-containing amino-based silane gas may be performed once or a plurality of times. In this case, as described at the outset, a SiCN film is formed and is oxidized by oxygen. Thus, "N" is substituted by "O", eventually forming a SiCO film.

The second to thirteenth examples described above can provide the same advantageous effects as provided by the first example. The respective examples described in respect of the first process and the respective examples described in connection with the second process may be arbitrarily combined and carried out.

Evaluation of the Present Disclosure

Figure 15:
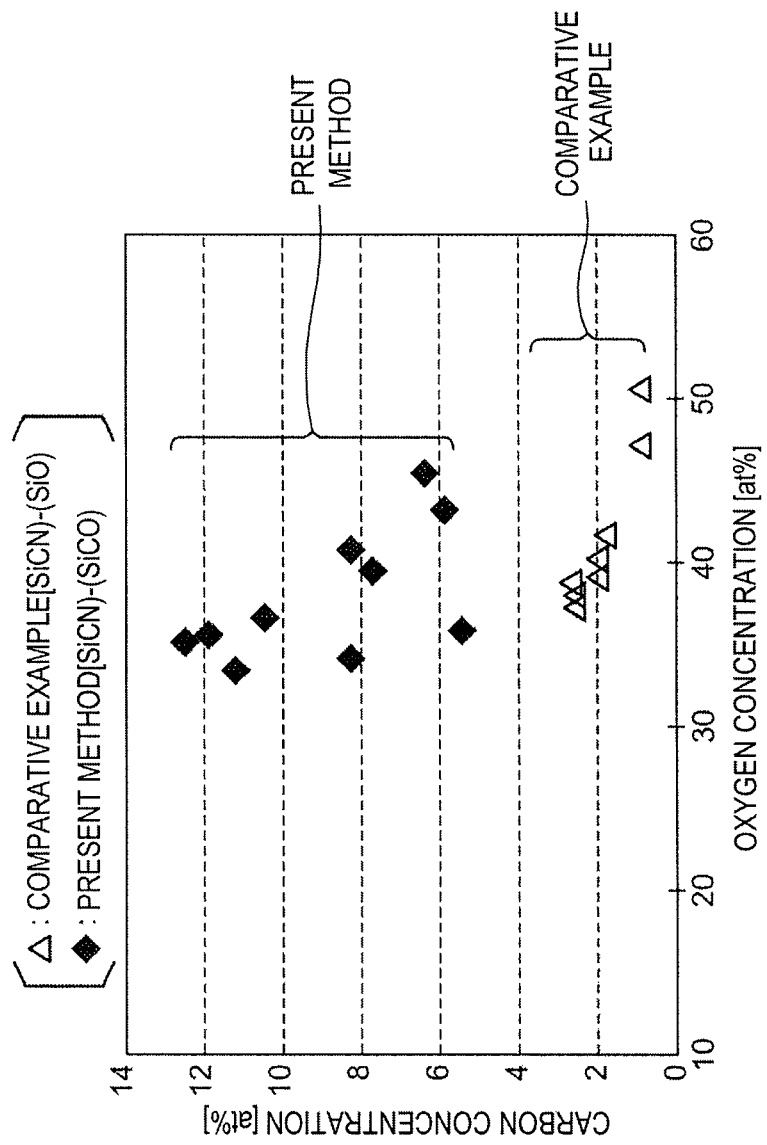
FIG. 15 is a graph representing the concentrations of oxygen and carbon contained in a thin film when a SiOCN film is formed using the film forming method according to the present disclosure.

Next, description will be made on the evaluation results of a film forming process actually performed using the film forming method of the present disclosure. FIG. 15 is a graph representing the concentrations of oxygen (O) and carbon (C) contained in a thin film when a SiOCN film is formed using the film forming method according to the present disclosure. The first example was used as the film forming method of the present disclosure. As a comparative example, a SiOCN film was formed by the film forming method described in JP12-160704A. The O concentration and the C concentration of the SiOCN film thus formed were measured. In the film forming method disclosed in JP12-160704A, a SiCN and a SiO film are alternately and repeatedly formed.

As represented in FIG. 15, in the comparative example, the O concentration is about 35 to 50 at % and the C concentration is about 1 to 3 at %. The C concentration is significantly low. In contrast, in the present method, the O concentration is about 33 to 46 at % which is substantially equal to the O concentration of the comparative example. However, the C concentration in the present method is about 5 to 13 at %. It can be seen that the C concentration is far higher than that of the comparative example, which result is satisfactory.

In the respective examples described above, the $N_2$ gas is used as the purge gas. However, the present disclosure is not limited thereto. It may be possible to use a $H_2$ gas or an inert gas other than the $N_2$ gas, e.g., a noble gas such as an Ar gas or a He gas. In particular, if a $H_2$ gas (including radicals of the $H_2$ gas) is used as the purge gas in the purge operation performed immediately after the step for supplying at least the silane-based gas, the adhering action of "C" or "N" can be accelerated in the C supply operation or the N supply operation performed thereafter.

In the respective examples described above, at least one of the nitriding gas and the oxidizing gas may be activated and used in an activated state. Plasma can be used as a unit for activating the nitriding gas and the oxidizing gas. For example, an antenna connected to a high-frequency power source can be installed in the outer wall of the nozzle accommodating recess portion 60 shown in FIG. 1 to activate (make radical) the nitriding gas ($NH_3$) and the oxidizing gas ($O_2$) supplied into the processing vessel 4.

In the respective examples described above, the HCD gas is used as the silane-based gas. However, the present disclosure is not limited thereto. The silane-based gas may be one or more gases selected from the group consisting of hexachlorodisilane (HCD), dichlorosilane (DCS), monosilane ($SiH_4$), disilane ($Si_2H_6$), hexamethyldisilazane (HMDS), tetrachlorosilane (TCS), disilylamine (DSA), trisilylamine (TSA), bis-(tertiary butyl amino)-silane (BTBAS), diisopropylaminosilane (DIPAS) and amino-based silane gases.

In this case, BTBAS, DIPAS or the like can be used as the carbon-containing amino-based silane gas among the amino-based silane gases. DSA, TSA or the like can be used as the amino-based silane gas which does not contain carbon.

In the respective examples described above, propylene is used as the hydrocarbon gas. However, the present disclosure is not limited thereto. The hydrocarbon gas may be one or more gases selected from the group consisting of propylene, acetylene, ethylene, methane, ethane, propane and butane.

In the respective examples described above, an $NH_3$ gas is used as the nitriding gas. However, the present disclosure is not limited thereto. The nitriding gas may be one or more gases selected from the group consisting of ammonia ($NH_3$), dinitrogen monoxide ($N_2O$) and nitrogen monoxide (NO).

In the respective examples described above, an $O_2$ gas is used as the oxidizing gas. However, the present disclosure is not limited thereto. The oxidizing gas may be one or more gases selected from the group consisting of oxygen ($O_2$), ozone ($O_3$), dinitrogen monoxide ($N_2O$) and nitrogen monoxide (NO).

Figure 3:
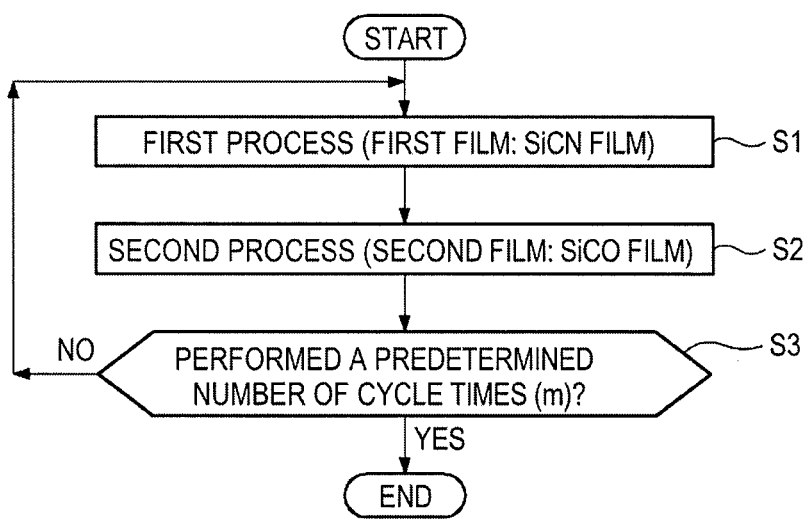
FIG. 3 is a flowchart schematically illustrating a film forming method according to the present disclosure.

In the respective examples described above, the first process is initially performed and then the second process is performed (see FIG. 3). However, these processes may be performed in the reverse order. That is to say, the second process may be initially performed and then the first process may be performed.

In the present disclosure, description has been made by taking the semiconductor wafer as an example of the workpiece. The semiconductor wafer includes a silicon substrate and a compound semiconductor substrate made of GaAs, SiC, GaN or the like. The workpiece is not limited to these substrates. The present disclosure can be applied to a glass substrate used in a liquid crystal display, a ceramic substrate, and so forth.

According to the film forming method and apparatus of the present disclosure, it is possible to provide the following superior advantageous effects. In a method of forming a thin film composed of SiOCN layers, it is possible to improve (reduce) a relative dielectric constant and to enhance an etching resistance by sufficiently increasing not only an oxygen concentration but also a carbon concentration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a thin film composed of a SiOCN layer containing at least silicon (Si), oxygen (O), carbon (C) and nitrogen (N) on a surface of a workpiece within an evacuable processing vessel optionally using a silane-based gas, a hydrocarbon gas, a nitriding gas or an oxidizing gas, the method comprising:
  forming a first film including at least Si, C and N; and
  forming a second film including at least Si, C and O,
  wherein a cycle including the forming a first film and the forming a second film is performed two or more times.

2. The method of claim 1, wherein the forming a first film comprises:
  a Si supply operation for supplying the silane-based gas;
  a C supply operation for supplying the hydrocarbon gas; and
  an N supply operation for supplying the nitriding gas,
  wherein a cycle including the Si supply operation, the C supply operation and the N supply operation is performed one or more times.

3. The method of claim 2, wherein the hydrocarbon gas is supplied during at least one of the Si supply and the N supply operation.

4. The method of claim 2, wherein the nitriding gas is supplied during the C supply operation.

5. The method of claim 2, wherein a purge operation for supplying an inert gas or a hydrogen gas as a purge gas is performed between the respective supply operations.

6. The method of claim 5, wherein the purge operation for supplying the hydrogen gas as the purge gas is performed immediately after the Si supply operation for supplying the silane-based gas.

7. The method of claim 1, wherein the forming a first film comprises:
  a Si supply operation for supplying the silane-based gas; and
  a C/N simultaneous supply operation for simultaneously supplying the hydrocarbon gas and the nitriding gas,
  wherein a cycle including the Si supply operation and the C/N simultaneous supply operation is performed one or more times.

8. The method of claim 1, wherein the forming a first film comprises:
  a Si/C continuous supply operation in which a cycle including a Si supply operation for supplying the silane-based gas and a C supply operation for supplying the hydrocarbon gas is performed a plurality of times; and
  an N supply operation for supplying the nitriding gas,
  wherein a cycle including the Si/C continuous supply operation and the N supply operation is performed one or more times.

9. The method of claim 1, wherein the forming a first film comprises:
  a Si/C simultaneous supply operation for simultaneously supplying the silane-based gas and the hydrocarbon gas; and
  an N supply operation for supplying the nitriding gas, and
  wherein a cycle including the Si/C simultaneous supply operation and the N supply operation is performed one or more times.

10. The method of claim 1, wherein the forming a first film comprises an amino-based silane supply operation for supplying a carbon-containing amino-based silane gas as the silane-based gas.

11. The method of claim 1, wherein the forming a first film comprises:
  an amino-based silane supply operation for supplying a carbon-containing amino-based silane gas as the silane-based gas; and
  an N supply operation for supplying the nitriding gas,
  wherein a cycle including the amino-based silane supply operation and the N supply operation is performed one or more times.

12. The method of claim 1, wherein the forming a second film comprises:
  a Si supply operation for supplying the silane-based gas;
  a C supply operation for supplying the hydrocarbon gas; and
  an O supply operation for supplying the oxidizing gas,
  wherein a cycle including the Si supply operation, the C supply operation and the O supply operation is performed one or more times.

13. The method of claim 12, wherein the hydrocarbon gas is supplied during at least one of the Si supply operation and the O supply operation.

14. The method of claim 12, wherein the oxidizing gas is supplied during the C supply operation.

15. The method of claim 1, wherein the forming a second film comprises:
  a Si supply operation for supplying the silane-based gas; and
  a C/O simultaneous supply operation for simultaneously supplying the hydrocarbon gas and the oxidizing gas,
  wherein a cycle including the Si supply operation and the C/O simultaneous supply operation is performed one or more times.

16. The method of claim 1, wherein the forming a second film comprises:
  a Si/C continuous supply operation in which a cycle including a Si supply operation for supplying the silane-based gas and a C supply operation for supplying the hydrocarbon gas is performed a plurality of times; and
  an O supply operation for supplying the oxidizing gas,
  wherein a cycle including the Si/C continuous supply operation and the O supply operation is performed one or more times.

17. The method of claim 1, wherein the forming a second film comprises:
  a Si/C simultaneous supply operation for simultaneously supplying the silane-based gas and the hydrocarbon gas; and
  an O supply operation for supplying the oxidizing gas,
  wherein a cycle including the Si/C simultaneous supply operation and the O supply operation is performed one or more times.

18. The method of claim 1, wherein the forming a second film comprises:
  an amino-based silane supply operation for supplying a carbon-containing amino-based silane gas as the silane-based gas; and
  an O supply operation for supplying the oxidizing gas,
  wherein a cycle including the amino-based silane supply operation and the O supply operation is performed one or more times.

19. The method of claim 1, wherein at least one of the nitriding gas and the oxidizing gas is activated.

20. The method of claim 1, wherein the silane-based gas is one or more gases selected from the group consisting of hexachlorodisilane (HCD), dichlorosilane (DCS), monosilane ($SiH_4$), disilane ($Si_2H_6$), hexamethyldisilazane (HMDS), tetrachlorosilane (TCS), disilylamine (DSA), trisilylamine (TSA), bis-(tertiary butyl amino)-silane (BTBAS), diisopropylaminosilane (DIPAS) and amino-based silane gases.

21. The method of claim 1, wherein the hydrocarbon gas is one or more gases selected from the group consisting of propylene, acetylene, ethylene, methane, ethane, propane and butane.

22. The method of claim 1, wherein the nitriding gas is one or more gases selected from the group consisting of ammonia ($NH_3$), dinitrogen monoxide ($N_2O$) and nitrogen monoxide (NO).

23. The method of claim 1, wherein the oxidizing gas is one or more gases selected from the group consisting of oxygen ($O_2$), ozone ($O_3$), dinitrogen monoxide ($N_2O$) and nitrogen monoxide (NO).

* * * * *